United States Patent [19]
Okita

[11] Patent Number: 5,747,830
[45] Date of Patent: May 5, 1998

[54] SEMICONDUCTOR DISPLAY DEVICE WITH A HYDROGEN SUPPLY AND HYDROGEN DIFFUSION BARRIER LAYERS

[75] Inventor: Akira Okita, Yamato, Japan

[73] Assignee: Canon Kabushiki Kaisha, Tokyo, Japan

[21] Appl. No.: 714,440

[22] Filed: Sep. 16, 1996

[30] Foreign Application Priority Data

Sep. 14, 1995 [JP] Japan .................................. 7-236866
Sep. 12, 1996 [JP] Japan .................................. 8-241935

[51] Int. Cl.$^6$ .......................... H01L 29/04; H01L 31/036
[52] U.S. Cl. .................. 257/72; 257/59; 249/110; 249/111
[58] Field of Search .................. 257/59, 72; 349/110, 349/111

[56] References Cited

U.S. PATENT DOCUMENTS 4,759,610  7/1988  Yanagisawa ............................ 350/334
5,499,123  3/1996  Mikoshiba ............................. 349/110

FOREIGN PATENT DOCUMENTS

60-045219  3/1985  Japan .
03293731  12/1991  Japan .
06209012  7/1994  Japan .

*Primary Examiner*—Tom Thomas
*Assistant Examiner*—Fetsum Abraham
*Attorney, Agent, or Firm*—Fitzpatrick, Cella, Harper & Scinto

[57] ABSTRACT

The invention provides a semiconductor device having a low threshold voltage and capable of operating at a high speed, and also provides an active matrix display device including such a semiconductor device. The invention also provides a method of producing such a semiconductor device and an active matrix display device. In the invention, a hydrogen supply layer is disposed above semiconductor layers in such a manner that the hydrogen supply layer is apart from the semiconductor layers. A hydrogen diffusion barrier layer for preventing hydrogen from diffusing outward from the hydrogen supply layer is disposed on the hydrogen supply layer in such a manner that the hydrogen diffusion barrier layer is in direct contact with the hydrogen supply layer. The hydrogen diffusion barrier layer is preferably made of a high melting point metal or a compound thereof. The hydrogen supply layer is preferably formed by depositing SiN or amorphous silicon by means of plasma CVD.

25 Claims, 10 Drawing Sheets

SEMICONDUCTOR DISPLAY DEVICE WITH A HYDROGEN SUPPLY AND HYDROGEN DIFFUSION BARRIER LAYERS

BACKGROUND OF THE INVENTION

1. Field of the Invention

The present invention relates to a semiconductor device and an active matrix liquid crystal display device, and also to a production method thereof.

2. Related Background Art

In recent years, there has been an increasing need for a liquid crystal display device capable of displaying an image with higher resolution. Among various types, a liquid crystal display device of the active matrix type in which pixels are switched by thin film switching devices has been developed rapidly since a crosstalk occurs little even when the number of pixels is increased and a high-quality image with a high gradation can be easily achieved.

Figure 11A:
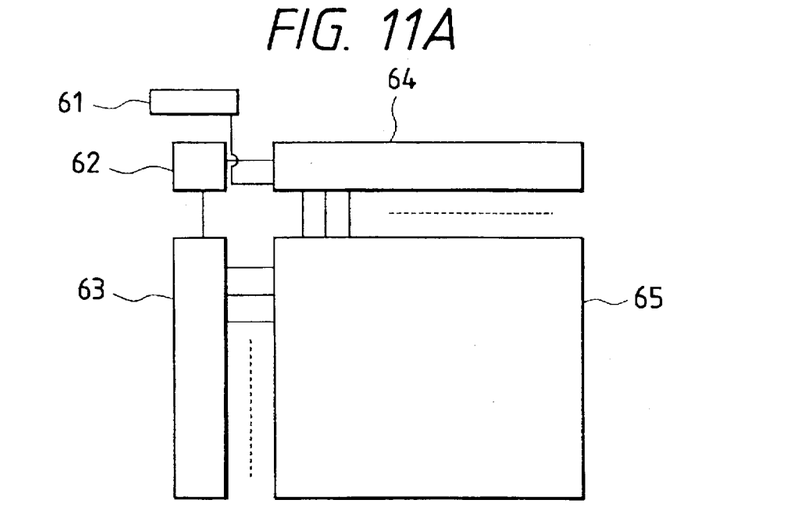
FIG. 11A is a block diagram of an active matrix type liquid crystal display device.
Figure 11B:
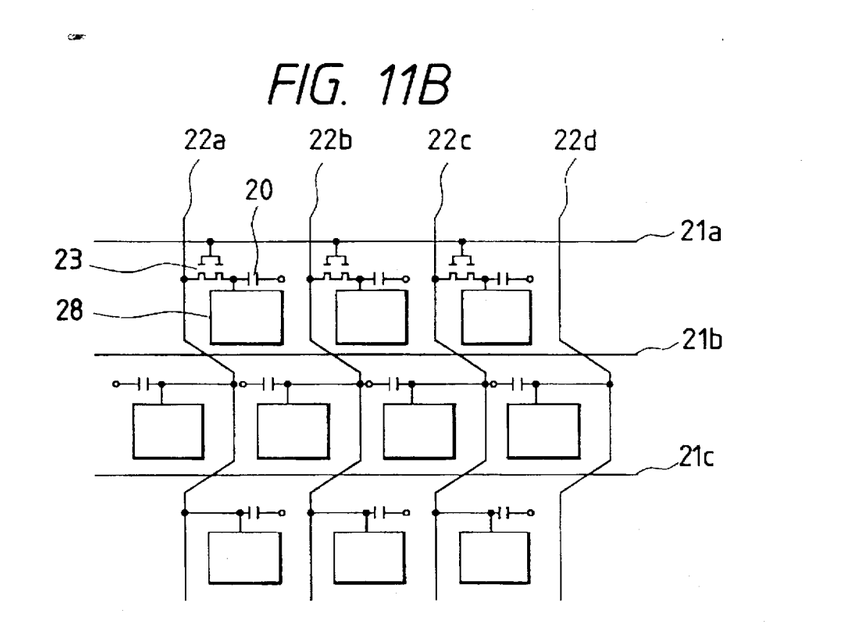
FIG. 11B is an enlarged view of the image display unit thereof.

In active matrix type liquid crystal display panels with a size greater than 5 inches, the thin film transistor (TFT) using amorphous silicon (a-Si) and, in the case of display panels with a size smaller than 5 inches, the thin film transistor using polysilicon (p-Si) is used for a thin film switching device, respectively. FIG. 11A is a block diagram of the active matrix type liquid crystal display device and FIG. 11B is an enlarged view of an image display unit thereof. In FIG. 11A, reference numeral 61 denotes a video signal circuit; 62 is a synchronizing circuit; 63 is a vertical shift register; 64 is a horizontal shift register; and 65 is an image display unit. In FIG. 11B, reference numerals 21a, 21b and 21c denote scanning interconnections; 22a, 22b, 22c and 22d are data interconnections; 20 is a storage capacitance; 23 is a thin film transistor (TFT); and 28 is a pixel electrode. The video signal circuit 61 outputs a television signal to the horizontal shift register 64. The horizontal shift register 64 samples the television signal corresponding to each pixel of the image display unit 65. The vertical shift register 63 controls the timing of selecting a row of image display unit 65. The synchronizing circuit 62 controls the timing of the operation of vertical shift register 63 and horizontal shift register 64. In the image display unit shown in FIG. 11B, TFT 23, storage capacitor 20 and pixel electrode 28 are disposed at each intersection of the scanning interconnections 21a, 21b and 21c and the data interconnections 22a, 22b, 22c and 22d. The vertical shift register 63 outputs a row selection pulse which is supplied to the image display unit through the scanning interconnections 21a, 21b, and 21c. TFTs turn ON and OFF in response to row selection pulses. As a result a television signal is written in the pixel electrodes 28 and storage capacitors 20 through the data interconnections 22a, 22b, 22c, and 22d.

In recent display devices, the vertical shift register 63 and the horizontal shift register 64 as well as the TFTs are formed of polycrystalline silicon, wherein the image display unit 65, the vertical shift register 63 and the horizontal shift register 64 are all integrated on a single substrate. Among these elements, the TFTs made of a polycrystalline silicon are required to operate at a high enough speed to write an electric charge into pixels in a few μsec. To achieve the above requirement, there have been made various research efforts to improve the operation speed of TFTs by increasing the carrier mobility of semiconductor materials. Two techniques are known to achieve a high-speed operation in TFTs. One technique is to make a grain size of a polycrystalline silicon large. Another technique is to fill traps present at grain boundaries of the polycrystalline silicon with hydrogen. In the former technique, for example, polycrystalline silicon is deposited by pyrolytically decomposing silane gas at a reduced pressure and then annealed at about 600° C. for a long time. In the latter technique, for example, polycrystalline silicon is formed by pyrolytically decomposing silane gas at a reduced pressure, and SiN is then deposited thereon using for example the plasma CVD technique in an ambient containing a high concentration of hydrogen. After that, heat treatment is performed so that hydrogen is combined with the polycrystalline silicon.

In this technique there are two methods are proposed as follows: (1) Hydrogen included in a plasma SiN film, which is usually used as a passivation film on the top of an element, is diffused into TFTs, and (2) As disclosed in for example Japanese Patent Application Laid-Open Nos. 3-293731 or 6-209012, a hydrogen supply layer is formed directly on a non-single crystal semiconductor layer (TFT), and then a cap layer is formed thereon to prevent hydrogen from diffusing outward, thereby ensuring that the hydrogenation may be performed more effectively.

Figure 12A:
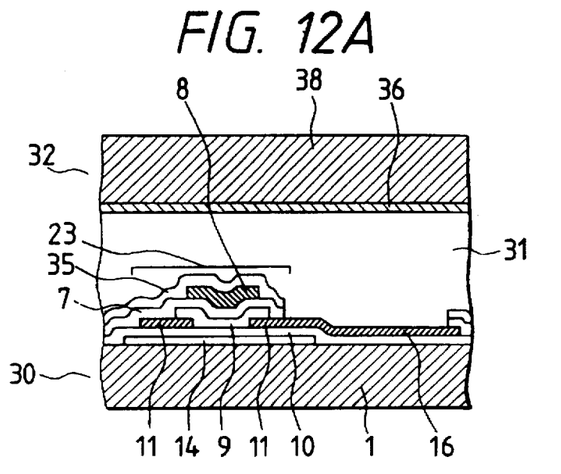
FIGS. 12A and 12B are each a cross-sectional view of a TFT constituting one pixel.
Figure 12B:
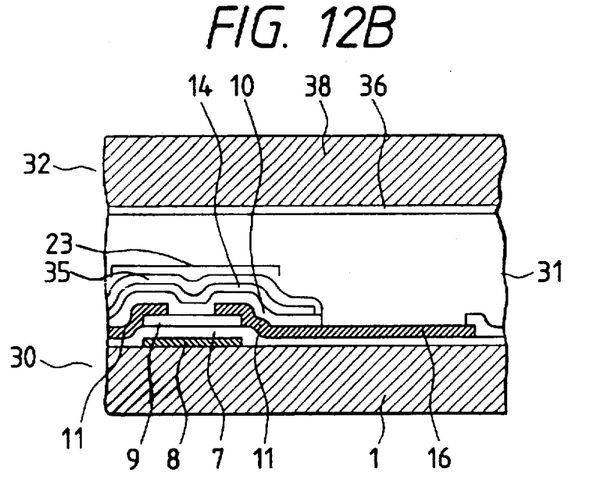

FIGS. 12A and 12B are each a cross-sectional view of a TFT composing one pixel in the image display unit. FIG. 12A illustrates a TFT having a gate electrode located above a channel and FIG. 12B illustrates an inverted-stagger type TFT having a gate electrode disposed beneath a channel. In FIGS. 12A and 12B, reference numeral 23 denotes a TFT; 9 is a channel region; 7 is a gate insulating film; 8 is a gate electrode; 10 is an interlayer insulating film; 11 is source and drain electrodes; 16 is a pixel electrode; 30 is an active matrix substrate; 1 is a base substrate of the active matrix substrate; 31 is a liquid crystal material; 32 is a common electrode substrate; 35 is a protective film; 36 is a common transparent electrode; and 38 is a base substrate of the common electrode substrate. When the TFT 23 turns ON, an image signal is written into the pixel 16. Here, FIGS. 12A and 12B illustrate structures disclosed in Japanese Patent Application Laid-Open No. 60-45219 or the U.S. Pat. No. 4,759,610. In these structures, the storage capacitance is formed with the pixel electrode 16 and the light blocking layer 14.

However, in a conventional method of making a carrier mobility large, there has been many drawbacks as follows.

In the technique based on making a grain size of polycrystalline silicon large by annealing, it is required to perform the annealing process for a long time, which results in a decrease in throughput and thus inevitably an increase in cost at mass-production. In the first technique (1) of those to combine hydrogen with polycrystalline silicon, the plasma SiN (p-SiN) film used to performing hydrogenation on a TFT is also used as a passivation film of the semiconductor device. Therefore, the p-SiN film is disposed on the top of the semiconductor device or, in the case where the top layer is a pixel electrode, the p-SiN film is disposed under the pixel electrode. Thus, in this structure, the p-SiN film is located far from the TFT, or a light blocking film is disposed between the p-SiN film and the TFT. As a result, there may be a problem that a high-temperature and/or long-time heat treatment is required for hydrogen to diffuse from the p-SiN film to the TFT.

On the other hand, in the technique (2) described above, a hydrogen supply source is formed in such a manner that it is contacted with a TFT, and thus hydrogenation is easily performed. However, when forming the above-described hydrogen supply source, the TFT is directly exposed to a plasma, which causes problems such as a reduction in the breakdown voltage of the gate insulating film or a change in the threshold voltage of the TFT. Accordingly, there may be a problem that it is difficult to produce a high-performance TFT with a high production yield.

SUMMARY OF THE INVENTION

In view of the above, it is an object of the present invention to provide a high-reliable semiconductor device having a high carrier mobility, an active matrix liquid crystal display device having a semiconductor device serving as a switching device, and a production method thereof.

According to an aspect of the present invention, there is provided a semiconductor device comprising a hydrogen supply layer disposed above a semiconductor region in such a manner that the hydrogen supply layer is diposed apart from the semiconductor region; and a hydrogen diffusion barrier layer made of a high melting point metal or a compound thereof, the hydrogen diffusion barrier layer being located on the hydrogen supply layer in such a manner that the hydrogen diffusion barrier layer is contacted with the hydrogen supply layer. Preferably, the semiconductor region described above includes source, drain and channel regions of the thin film transistor. Furthermore, the semiconductor region is preferably made of polycrystalline silicon or amorphous silicon. Preferably, the hydrogen supply layer is made of SiN or amorphous silicon. Preferably, the hydrogen diffusion barrier layer is disposed so as to be present above at least the whole semiconductor region. The high melting point metal is preferably Ti, Ta or W. A compound of the high melting point metal is preferably TiN or TaN. The hydrogen supply layer and the hydrogen diffusion barrier layer may be formed in the same form.

According to another aspect of the present invention, there is provided a display device comprising an active matrix substrate including a semiconductor device of the present invention, disposed with a pixel electrode on the hydrogen diffusion barrier via an insulating layer and the hydrogen diffusion barrier layer being a light blocking layer; an opposite substrate located opposite to the active matrix substrate; and a liquid crystal material disposed between the active matrix substrate and the opposite substrate. In this display device, the pixel electrode is switched by the semiconductor device. Preferably, the hydrogen diffusion barrier layer is made of an electrically conductive material having a fixed potential. Furthermore, similar semiconductor regions are preferably formed at intersections of a plurality of data interconnections and a plurality of scanning interconnections on the active matrix substrate. Preferably, the insulating layer is made of SiN. The active matrix substrate is preferably formed on an underlying substrate such as a glass substrate, a quartz substrate, or a single-crystal silicon substrate. In the case where a single-crystal silicon substrate is employed as the underlying substrate, the portion of the single-crystal silicon substrate under the image display area may be removed so as to obtain a light transmission type display device. The active matrix substrate may include a driving circuit disposed in a peripheral area of the image display area. The display device may be of either the type in which the pixel electrode is transparent so that an image is displayed by passing the incident light through the pixel electrode, or the type in which the pixel electrode is reflective so that an image is displayed by reflecting the incident light. The display device of the invention may be used in conjunction with an enlarging optical system so as to project an image on a screen. The display device of the invention may also be installed on spectacles.

According to another aspect of the present invention, there is provided a display device comprising an active matrix substrate on which pixel transistors and pixel electrodes are disposed at intersections of a plurality of data interconnections and a plurality of scanning interconnections; a common electrode substrate having a common electrode formed thereon, the common electrode substrate being located opposite to the active matrix substrate; and a liquid crystal material disposed between the active matrix substrate and the common electrode substrate, the display device being characterized in that the above-described active matrix substrate comprises a hydrogen supply layer formed on the pixel transistors; and a light blocking layer formed on the hydrogen supply layer, wherein the above-described pixel electrodes are disposed on the light blocking layer via an insulating film.

Furthermore, the present invention also provides a method for producing the semiconductor device and the display device described above. The method for producing a semiconductor device of the present invention is characterized in that a hydrogen supply layer is formed on a semiconductor device by means of plasma CVD. Also, the method for producing a display device according to the present invention is characterized in that a hydrogen supply layer is formed on a semiconductor device by means of plasma CVD.

In the present invention, as described above, a hydrogen supply layer is formed above a semiconductor region in such a manner that the hydrogen supply layer is apart from the semiconductor region; and a hydrogen diffusion barrier layer is formed of a high melting point metal or a compound thereof in such a manner that the hydrogen diffusion barrier layer is located directly on the hydrogen supply layer. Thus, the present invention provides a semiconductor device having a high carrier mobility and exhibiting high reliability. More particularly, the present invention can provide a TFT capable of operating at a high speed. Furthermore, the present invention makes it possible to produce a high-resolution display device with a high production yield.

DESCRIPTION OF THE PREFERRED EMBODIMENT

The semiconductor device of the present invention will be described in further detail below by way of example with reference to a TFT used in an active matrix liquid crystal display device. However, the semiconductor device of the present invention is not limited to the TFT and it can also be applied to a wide variety of semiconductor circuits including a diode switch, scanning circuit, etc. Although it is desirable that the semiconductor region be made of polycrystalline silicon whose characteristics may be improved to a great degree by performing hydrogenation, amorphous silicon or single-crystal silicon may also be employed. The liquid crystal display panel according to the present invention may be employed as a display device in a wide variety of applications such as a television set for home use, a projector, a head-mounting display device, a three-dimensional video game machine, a lap-top computer, an electronic notebook (an electronic address book), a television conference system, a car navigation system, and an aircraft display panel.

Figure 1:
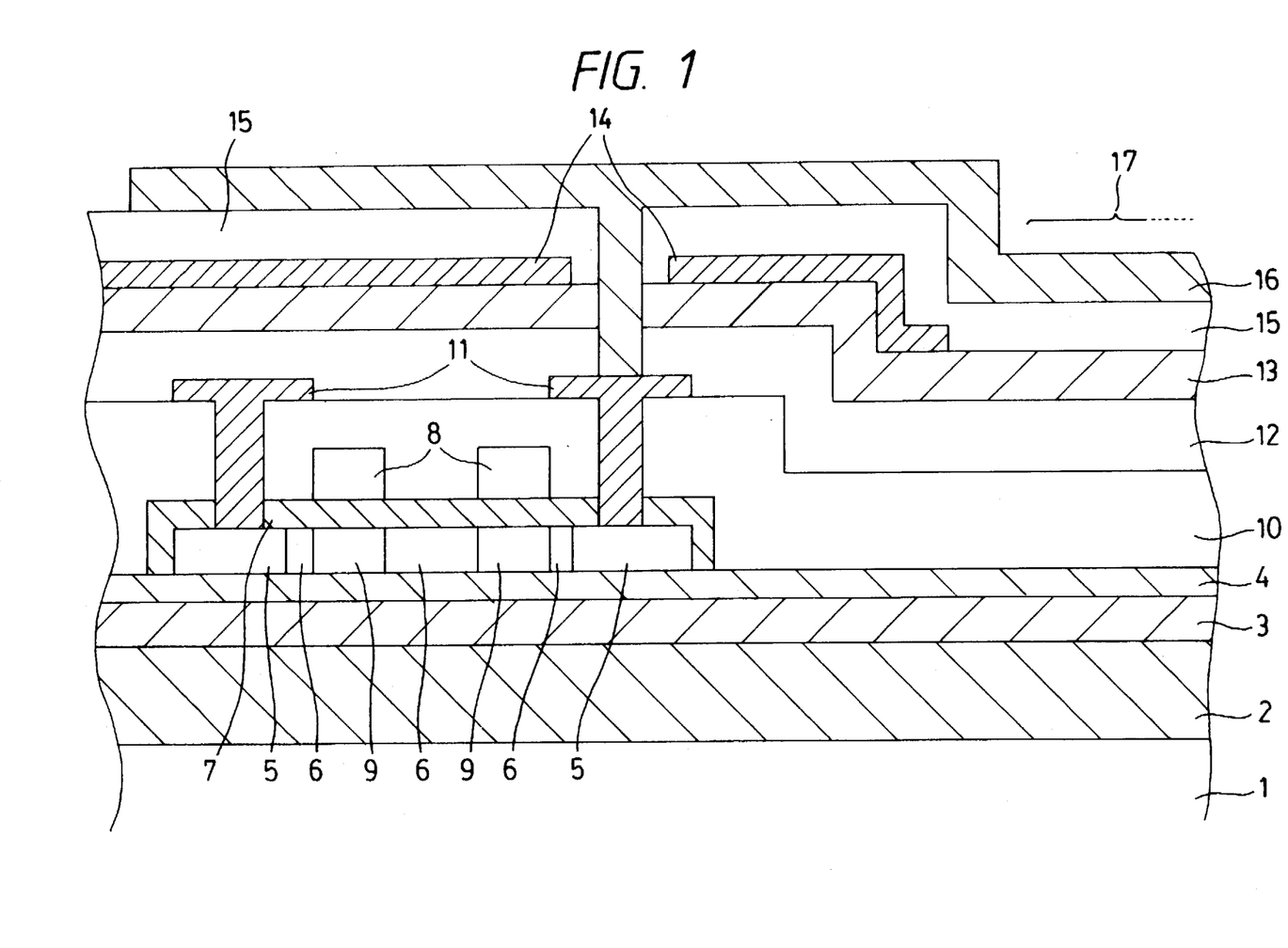
FIG. 1 is a cross-sectional view of a dual-gate p-channel thin film transistor according to the semiconductor device of the present invention.

As the specific embodiment, the semiconductor device of the present invention is now explained by the thin film transistor (TFT) of the dual-gate p-channel type of the liquid crystal display device. However, it should be understood that the invention is not limited to that. FIG. 1 is a cross-sectional view of an active matrix substrate including a thin film transistor used to switch pixels in the image display area of a liquid crystal display device. In FIG. 1, reference numeral 1 denotes a substrate; 2, 3 and 4 are silicon oxide films (SiO) or silicon nitride films (SiN); 5 is a heavily doped source and drain region of TFTs; and 6 is lightly doped source and drain region. Reference numeral 7 denotes a gate insulating film; 8 is gate electrodes; 9 is channels of TFTs; 10, 12 and 15 are interlayer insulating films; 11 is source and drain electrodes; 13 is a hydrogen supply layer; 14 is light blocking films; 16 is a pixel electrode; and 17 is a pixel display area. A scanning interconnection is connected to each gate electrode 8. In response to a row selection signal applied via the scanning interconnection, the corresponding TFT turns ON. As a result, a signal on the data interconnection is applied to the pixel electrode 16 via the channel 9. In the present invention, the term "semiconductor layer" is used to denote the heavily doped source and drain regions 5, the lightly doped source and drain regions 6, and the channel 9.

The heavily doped source and drain regions 5 and the lightly doped source and drain regions 6 are doped into a p-type, while the channel 9 is doped into an n-type. The lightly doped source and drain regions 6 are formed so as to relax the electric field. The gate insulating film 7 is formed of for example an SiO$_2$ film and the gate electrode 8 is formed of for example polycrystalline silicon doped into an n-type. In this specific example, there are two gate electrodes 8 in the form of the dual-gate structure so that the redundancy in the gate structure leads to an increase in the production yield. As for the substrate 1, a semiconductor substrate, a quartz substrate, or a glass substrate may be employed. The interlayer insulating film 10 is preferably made of BPSG (boron phosphine doped silicated glass) or the like. The interlayer insulating film 12 is preferably made of SiO or SiO$_2$ by means of the plasma CVD technique. The interlayer insulating film 15 is preferably made of SiO or SiN by means of the plasma CVD technique. The source and drain electrodes 11 are preferably made of Al and the like. In the case of the transmission type liquid crystal display device, the pixel electrode 16 is preferably made of ITO and the like. In the case of the reflection type liquid crystal display device, the pixel electrode 16 may be made of aluminum. A storage capacitor may be formed with the interlayer insulating film 15 serving as a dielectric material and the light blocking film 14 and the pixel electrode 16 serving as an electrode of the storage capacitor. The light blocking film 14 serving as the hydrogen diffusion barrier layer may be made of a metal film of Al, Ti, Ta, TiN, TaN, or W. As for the material of the light blocking film 14, high melting point metal such as Ti, W, or Ta or a compound thereof such as TiN or TaN is more desirable than Al because these materials cause little occurrence of hillocks and make it possible to form a thinner interlayer insulating film 15 which results in an increase in capacitance of the storage capacitor.

The hydrogen supply layer 13 is preferably an SiN film or an amorphous silicon film formed by means of the plasma CVD technique. The present invention is characterized in that the hydrogen supply layer 13 is located between the hydrogen diffusion barrier layer such as the light blocking film 14 and the semiconductor layer such as the source and drain regions 5 and 6 and the channel 9 in such a manner that the hydrogen supply layer 13 is not contacted with the semiconductor layer. Thus, this structure according to the invention suppresses the out-diffusion of hydrogen from the hydrogen supply layer 13. As a result, the TFT can be hydrogenated effectively. Furthermore, the TFT is protected from damage due to direct bombardment of the plasma. This makes it possible to produce a high-performance and high-reliable TFT with a high production yield.

If both interlayer insulating films 13 and 15 are formed of SiN by means of the plasma CVD technique, the resultant films become similar in characteristics. As a result, the generation of clacks is suppressed, which leads to an improvement in the production yield. Furthermore, hydrogenation is enhanced via the through-holes via which the pixel electrode 16 and the drain electrode 11 are connected to each other and therefore it is possible to achieve a TFT having improved characteristics.

A method for producing the dual-gate thin film transistor as shown in FIG. 1 will now be described below. At first, silane gas and ammonia gas are reacted with each other at a reduced pressure in the range of from 1 mTorr to 760 Torr so that an SiN film 3 having a thickness in the range from 100 to 400 nm is deposited on the oxidized surface of the substrate 1. Then, 10 to 50 nm of the surface of the SiN film 3 is oxidized so as to form an oxide/nitride film 4. This can be achieved for example by pyrolytically oxidizing the SiN film 3 at 1,000° C. for 400 minutes. Then silane gas diluted in nitrogen is pyrolytically decomposed at a pressure in the range of from 0.1 to 1.0 Torr at 550 to 700° C. so as to deposit a polycrystalline silicon film with a thickness of 50 to 200 nm. After that, for example, B$^+$ ion is then implanted therein to a dose of $1\times10^{12}$ cm$^2$. Annealing is then performed at 1,000° C. for 15 min. Subsequently, patterning is performed so as to form TFT areas (5, 6 and 9). It is desirable that the thickness of the polycrystalline silicon be as small as possible to suppress the leakage current of the TFT to a low enough level. More specifically, the thickness of the polycrystalline silicon is preferably in the range of from 10 to 60 nm. Next, a thermal oxide film with a thickness of 80 nm serving as the gate insulating film 7 is then formed at 1150° C. As a result of the formation of the thermal oxide film, the thickness of the polycrystalline silicon becomes 80 nm. Another technique of forming the gate insulating film 7 is there in which an oxide film is formed and then nitriding and oxidizing treatment is performed subsequently, thereby forming an ONO ($SiO_2$-SiN-$SiO_2$) film. Whatever technique is employed, it is important that the channel region of the TFT should not be directly exposed to the plasma. After forming the gate insulating film 7, a polycrystalline silicon film with a thickness of 100 to 500 nm serving as the gate electrode 8 is then deposited. The polycrystalline silicon film is then doped in a high concentration. After that, the polycrystalline silicon film is patterned into the gate electrode 8. Using the gate electrode as a mask, phosphorus ion is implanted in a self-alignment fashion to a dose of for example $5 \times 10^{13}$ $cm^{-2}$ so as to form the low-concentration source and drain region 6 serving as the electric field relaxation layer in the TFT. Patterning is then performed and for example phosphorus ion is implanted into the polycrystalline silicon film to a dose of $5 \times 10^{15}$ $cm^{-2}$, thereby forming the high-concentration source and drain region 5.

A BPSG film with a thickness of 700 nm is deposited by means of for example the TEOS (tetraethoxysilane) CVD technique, and the resultant BPSG film is subjected to a heat treatment at 1,000° C. for 10 minutes so as to reflow it, thereby forming an interlayer insulating film 10. Then, contact holes are formed in the interlayer insulating film 10, and, for example, a metal film such as an Al-Si (1%) film is deposited by means of for example the sputtering technique. The metal film is then patterned into the source and drain electrodes 11. As for the metal material, a multilayer film such as Ti/TiN/Al/TiN, high melting point metal such as Ti, W, Ta, or Mo, or a film composed of silicide thereof may be employed. Then the interlayer insulating film 12 of SiO with a thickness of for example 1,000 nm is formed by means of for example the plasma CVD technique. Subsequently, a plasma nitride film with a thickness of 270 nm is formed by means of for example the plasma CVD technique, thereby forming the hydrogen supply layer 13 for hydrogenating the TFT. This plasma nitride film preferably has a thickness in the range of from 1,400 to 4,100 nm. A Ti film with a thickness of 20 nm is then deposited by means of for example the sputtering technique and then is patterned so as to form the light blocking layer 14 serving as a hydrogen diffusion barrier. This hydrogen diffusion barrier preferably has a thickness in the range from 10 to 30 nm. After that, an interlayer insulating film 15 is formed by depositing a plasma nitride film with a thickness of for example 270 nm by means of for example the plasma CVD technique. This interlayer insulating film 15 may also be formed of a plasma nitride film. Through-holes for the source and drain electrodes are then formed by means of the patterning technique. Furthermore, an ITO film is deposited by means of for example the sputtering technique, and is then patterned so as to form the pixel electrode 16.

In the case of the liquid crystal display device shown in FIG. 1, a storage capacitor is formed with the light blocking film 14 disposed directly on the TFT, the pixel electrode 16 and the interlayer insulating film 15 disposed between them. In this invention, as described above, the storage capacitor is formed directly on the TFT, and therefore in the case of the transmission type liquid crystal display device a greater size of the pixel display area 17 can be achieved. This makes it possible to realize a liquid crystal display device having a high opening ratio and thus capable of displaying a bright image. In contrast, in the liquid crystal display device according to the conventional technique shown in FIGS. 12A and 12B, since the storage capacitor is disposed at the side of the TFT, it is impossible to achieve a high opening ratio.

Figure 2:
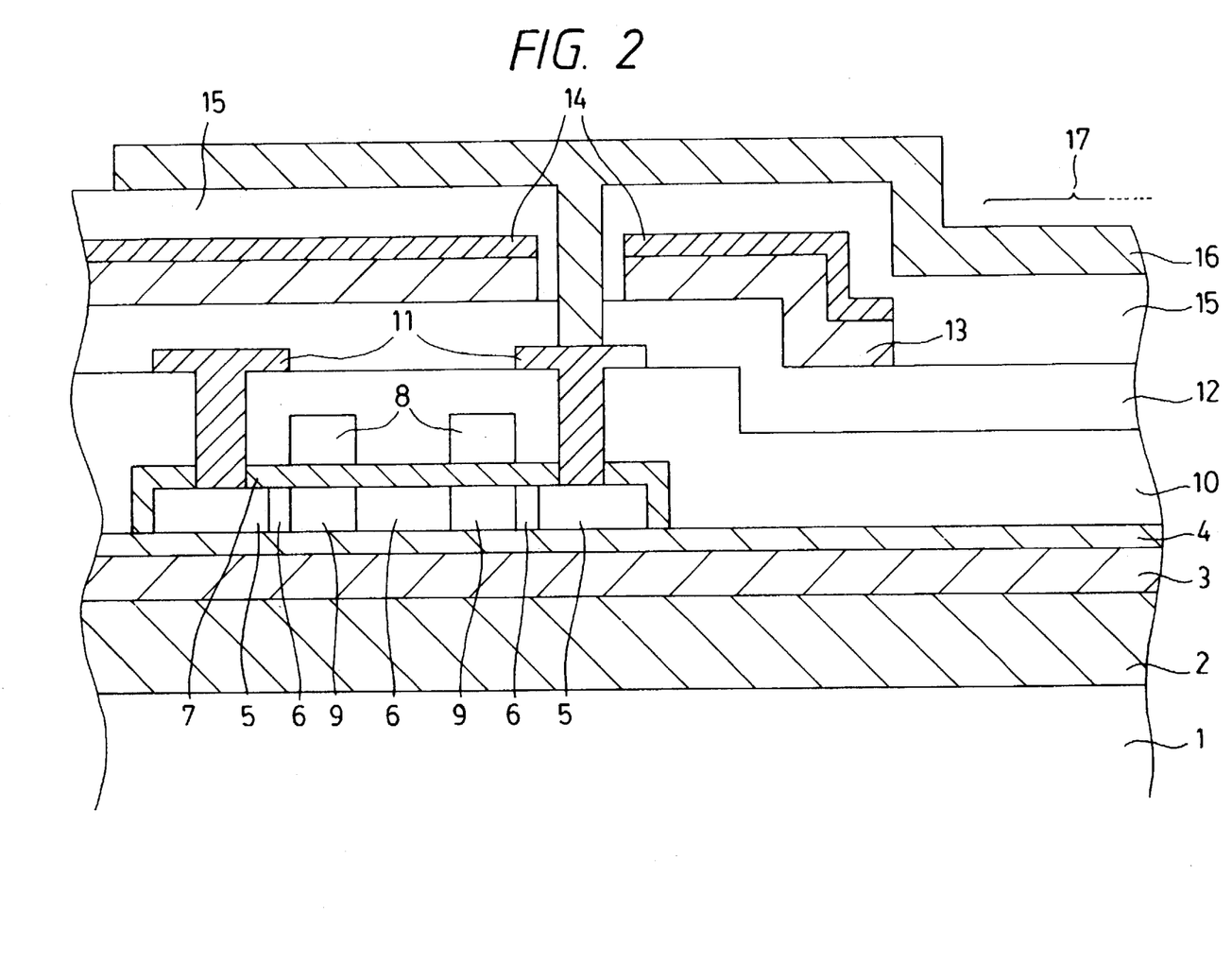
FIG. 2 is a cross-sectional view of a device having a hydrogen supply layer and a hydrogen diffusion barrier layer formed into the same pattern, according to the present invention.

In the present invention, the hydrogen supply layer and the hydrogen diffusion barrier layer are formed into the same pattern and therefore the patterning can be performed with a less number of mask processes. FIG. 2 is a cross-sectional view of an active matrix substrate having a hydrogen supply layer and a hydrogen diffusion barrier layer both formed into the same pattern. In this structure, since the hydrogen supply layer 13 cannot easily come into contact with the pixel electrode 16, amorphous silicon containing hydrogen can be employed as the hydrogen supply layer 13.

The structure shown in FIG. 2 can be formed as follows. An amorphous silicon layer containing hydrogen serving as the hydrogen supply layer is deposited for example by means of the plasma CVD technique. A high melting point metal layer serving as the hydrogen diffusion barrier layer is deposited by means of the sputtering technique or the like. Both the amorphous silicon layer and the high melting point metal layer are patterned using the same mask. As a result, the hydrogen supply layer 13 and the hydrogen diffusion barrier layer 14 have the same pattern as shown in FIG. 2. Other reference numerals in FIG. 2 have the same meaning as in FIG. 1.

EXAMPLE 1

Figure 3:
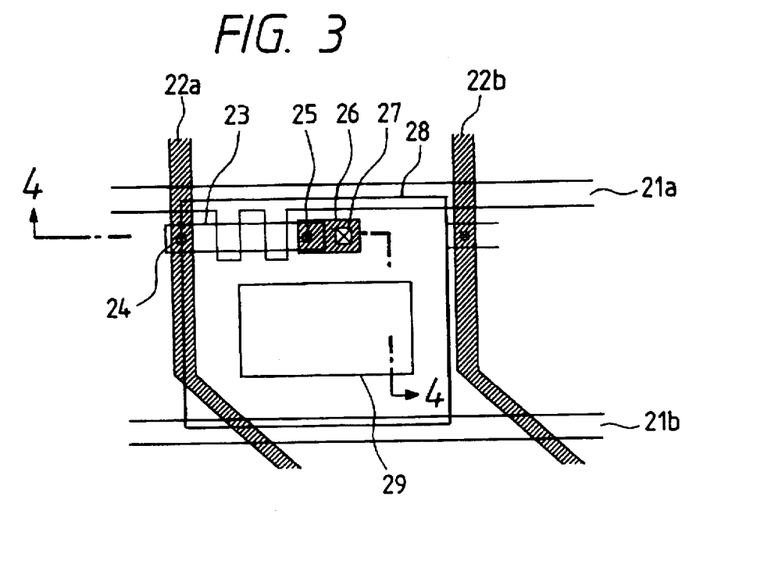
FIG. 3 is a schematic diagram illustrating one pixel of a liquid crystal display device according to Example 1.

The present invention will be described in further detail below with reference to specific embodiments. In Example 1, a liquid crystal display device of the transmission type will be shown. FIG. 3 is a schematic diagram of a pixel according to the present embodiment. In this figure, reference numerals 21 and 21b denote scanning interconnections; 22a and 22b are data interconnections; 23 is a TFT; 24 and 25 are contact holes; 26 is a metal electrode; 27 is a through-hole; 28 is a pixel electrode; and 29 is an opening formed in the light blocking film. The pixel electrode 28 is formed in a square shape with a size not more than 20 μm×20 μm. It is surrounded by two adjacent scanning interconnections 21a and 21b and two data interconnections 22a and 22b. The source of the TFT 23 formed of a polycrystalline silicon film is connected to the data interconnection 22a via the contact hole 24 so that a signal charge may be written into a drain via two gates. The drain of the TFT 23 is connected to the pixel electrode 26 via the contact hole 25. The metal electrode 26 is connected to the transparent pixel electrode 28 via the through-hole 27. The opening 29 is formed in such a manner that no light reaches the TFT.

Figure 4:
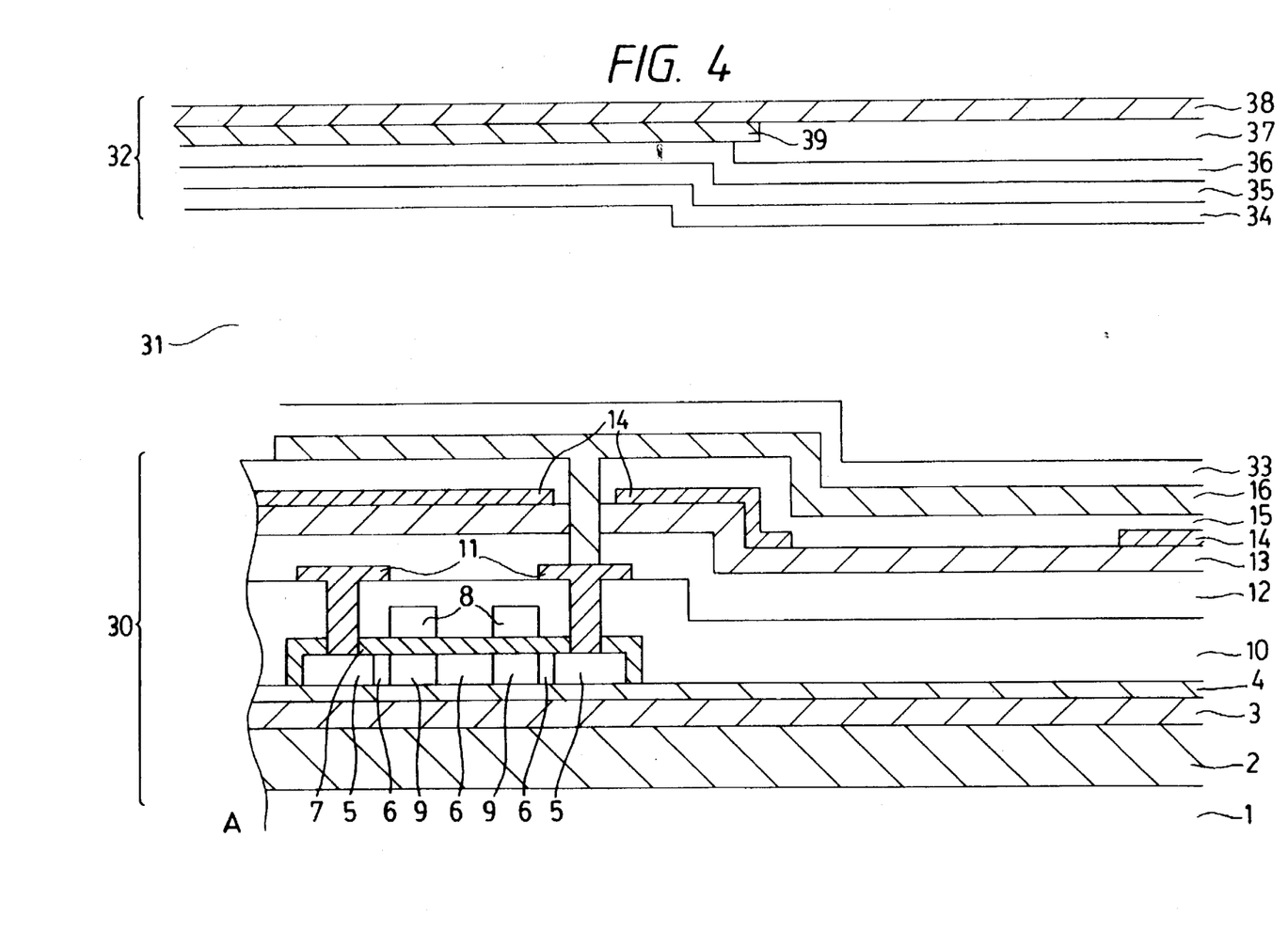
FIG. 4 is a cross-sectional view taken along line 4—4 of FIG. 3.

FIG. 4 is a cross-sectional view taken along line 4—4 of FIG. 3. In this figure, reference numeral 30 denotes an active matrix substrate; 31 is a liquid crystal material; 32 is a common electrode substrate; 33 and 34 are orientation films; 35 is a protective film; 36 is a common transparent electrode; 37 is a color filter; 38 is a base substrate; and 39 is a black matrix. The active matrix substrate 30 includes a substrate similar to that described above with reference to FIG. 1 wherein an orientation film 33 made of polyimide for causing orientation in the liquid crystal material 31 is provided on the substrate. A transparent quartz substrate or glass substrate may be employed as the base substrate 1. On the common electrode substrate 32, there are provided a color filter 37 including pigment and a black matrix 39 made of Cr.

In the liquid crystal display device according to the present embodiment, the leakage current between the source and drain of the TFT is suppressed to a low level. As a result, a charge can be held at the pixel electrode for a long time and thus it is possible to achieve a liquid crystal display device capable of displaying a high-contrast image. Furthermore, the display device includes a low density of defects such as white or black points. Therefore, it is possible to produce a liquid crystal display device with an extremely improved production yield. Other reference numerals in FIG. 4 have the same meaning as in FIG. 1.

EXAMPLE 2

In this second embodiment, the liquid crystal display device is also of the transmission type as in Example 1 described above. In this embodiment, a single-crystal silicon substrate is employed as the base substrate wherein the portion under the image display area is removed so that light can pass through the removed portion of the base substrate.

Figure 5:
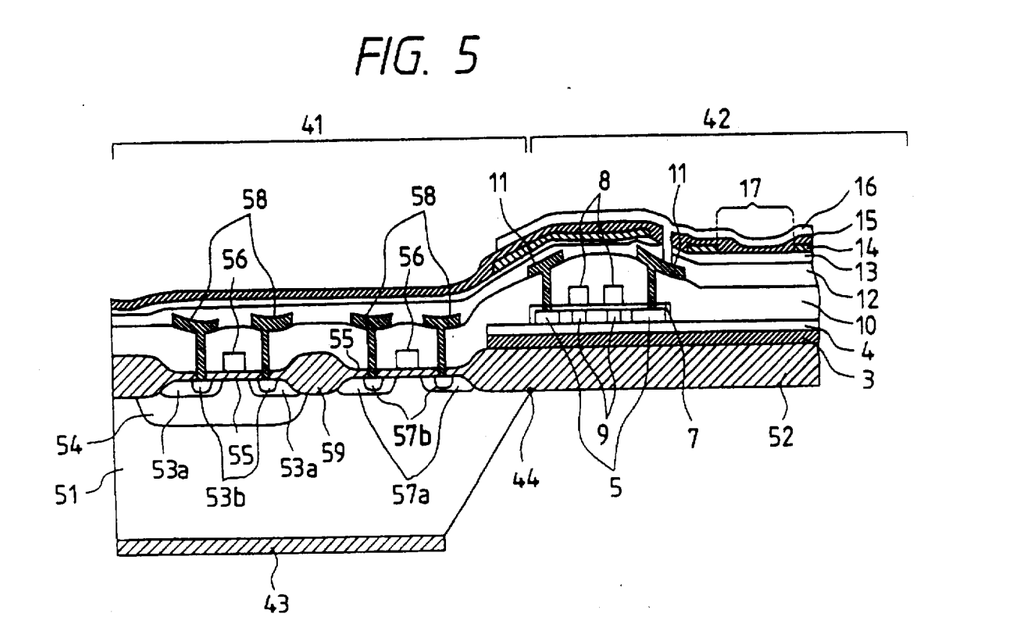
FIG. 5 is a cross-sectional view of an active matrix substrate according to Example 2.

Furthermore, a driving circuit for outputting a signal over the data interconnections and the scanning interconnections is formed on the single-crystal silicon substrate in a periphery area surrounding the image display area. FIG. 5 is a cross-sectional view of an active matrix substrate according to the present embodiment. In this figure, reference numeral 41 denotes a peripheral driving circuit part; 42 is an image display unit part; 51 is a silicon substrate; 59 is a thick oxide isolation film for separating elements; 53a is a low-concentration source and drain regions of an nMOSFET; 53b is a high-concentration source and drain regions of the nMOSFET; 54 is a p-well of the nMOSFET; 55 is a gate oxide film; 56 is a polycrystalline silicon gate electrode; 57a is low-concentration source and drain regions of a pMOSFET; 57b is high-concentration source and drain regions of the pMOSFET; and 58 is source and drain electrodes. Furthermore, reference numeral 43 denotes an oxide film on the back side; 44 is an etched edge; and 52 is a thick oxide film. In this embodiment, the TFT has a structure similar to that employed in Example 1 described above with reference to FIG. 4. In the present embodiment, a liquid crystal display device of the transmission type is realized by removing the portion of the silicon substrate 51 under the image display area 42 by means of etching. That is, the space under the thick oxide film 52 is created by the etching process. The etched edge 44 defines the size of the display area.

Figure 6A:
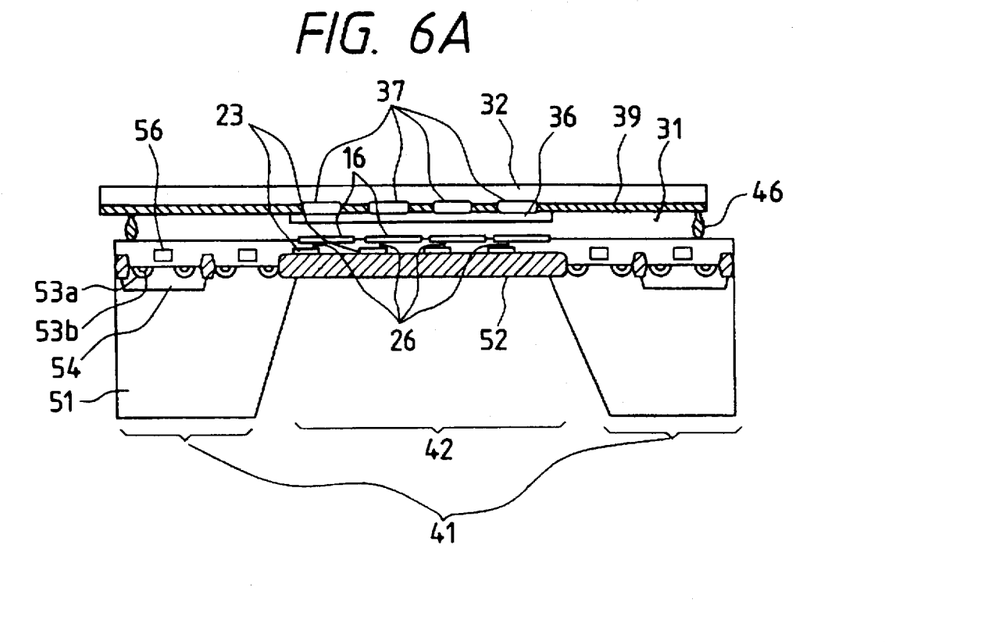
FIG. 6A is a cross-sectional view of a liquid crystal display device according to Example 2.
Figure 7:
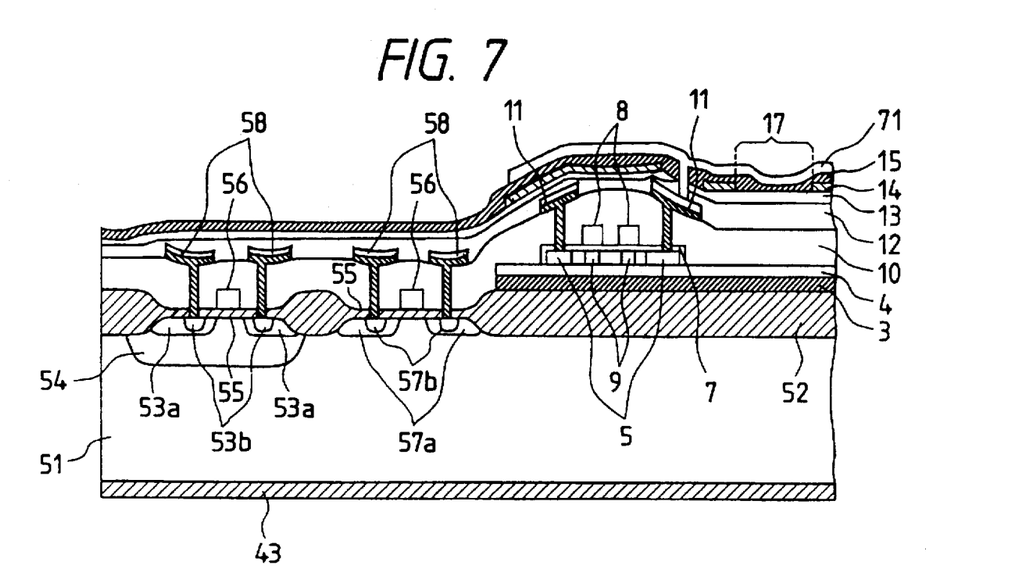
FIG. 7 is a cross-sectional view of an active matrix substrate according to Example 3.

FIG. 6A is a cross-sectional view illustrating the active matrix substrate shown in FIG. 7, which is mounted as a liquid crystal display device. Reference numeral 46 denotes a spacer for maintaining the thickness between both substrates at a value determined taking into account the optical characteristics of the liquid crystal material 31. The areas between pixels and the area of the peripheral driving circuit are covered with a black matrix 39 made of for example Cr so that light to these areas is blocked. Although twisted nematic (TN) liquid crystal is more preferable as the liquid crystal material 31, supertwisted nematic (STN) liquid crystal, ferroelectric liquid crystal (FLC), or polymer-diffused liquid crystal (PDLC) may also be employed. In the case where TN, STN or FLC is employed, it is required that a crossed-Nicol polarizing plate be provided on each substrate. A back light for illumination may be disposed either at an upper location or at a lower location in FIG. 6A. However, in this specific example having the structure shown in FIG. 6A, it is more desirable to dispose the back light at the upper location so as to achieve more tight blocking to the light. Other reference numerals in FIG. 6A have the same meaning as in preceding Figures.

Figure 6B:
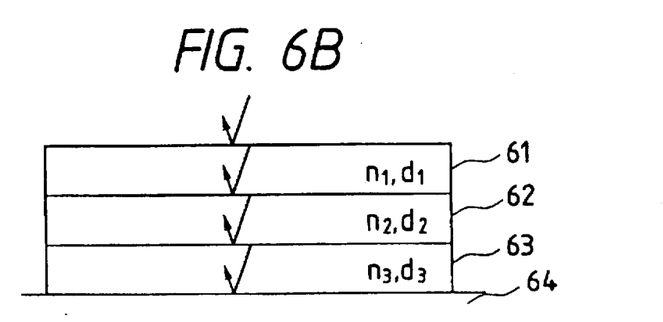
FIG. 6B is a cross-sectional view illustrating the film structure.

Furthermore, to achieve improved characteristics of the display panel, the film preferably has the following structure. FIG. 6B schematically illustrates the film structure employed in this embodiment to improve the optical characteristics of the film. The film has a multilayer structure consisting of layers 61, 62, 63 and 64 each having a different refractive index. In such a multilayer structure, reflection occurs at each interfacial plane. The reflection can be minimized by optimizing the refractive indexes $n_1$, $n_2$ and $n_3$ and thicknesses $d_1$, $d_2$ and $d_3$ of each layers. That is, when $n_1 \cdot d_1 = N_1 \cdot \lambda/2$, where $N_1$ is a natural number, the reflection is minimized. If it is possible to determine the thickness of each layer independently of each other, the optimum refractive index and thickness for the other two layers are given as $n_2 \cdot d_2 = N_2 \cdot \lambda/2$ and $n_3 \cdot d_3 = N_3 \cdot \lambda/2$, where $N_2$ and $N_3$ are a natural number, respectively. In the above equations, $\lambda$ denotes a wavelength of light. The wavelength $\lambda$ may be selected for example to 550 nm at which human eyes are most sensitive. In this embodiment, the SiN film grown either by the low-pressure CVD technique or by the plasma CVD technique has a refractive index n equal to 2.0. Therefore, if $\lambda=550$ nm, then $d=N \cdot 550/(2 \times 2.0) = 137.5 \cdot n$ (nm). In this embodiment, in the case where the SiN film is deposited by the low-pressure CVD technique, the layer thickness d is set to 400 nm nearly equal to 412.5 nm which is obtained by substituting N=3 into the above equation. For the SiN film deposited by the plasma CVD, the layer thickness d is set to 270 nm nearly equal to 275 nm which is obtained by substituting N=2 into the above equation. If an error in the layer thickness relative to the theoretically ideal value described above is less than 10%, it is possible to achieve small enough reflection.

In the display panel according to the present embodiment, the membrane disposed under the TFT preferably includes a layer having compressive stress and a layer having tensile stress, thereby achieving optimum expansion in the membrane. In the present embodiment, the LOCOS oxide film 52 has the greatest contribution to the compressive stress. For example, when the LOCUS oxide film has a thickness of 800 nm, the compressive stress causes a warp of 45 µm for a 5-inch wafer. On the other hand, the SiN film formed by the thermal CVD technique has the greatest tensile stress. For example, when its thickness is 400 nm, a 60-µm warp can occur. The other films have contribution to compressive stress which can result in a 15 µm warp. This means that the stresses in various films are canceled in total and thus substantially no warp occurs. Since a reduction in thickness of the LOCOS oxide film 52 occurs during the silicon removal process, the membrane has a final structure having a slight tensile stress which is desirable to expand the membrane in a highly reliable fashion.

Thus, the liquid crystal display device of the present embodiment can display a high-contrast image with a high gradation which cannot be achieved by the conventional technique. In particular, since the driving circuit is formed on the high-quality single crystal silicon substrate, it is possible to achieve a display device having a reduced size. Furthermore, the minimized reflection leads to a high transparency. Still furthermore, the membrane is expanded with an optimized stress. This results in an improvement in production yield.

EXAMPLE 3

Figure 8:
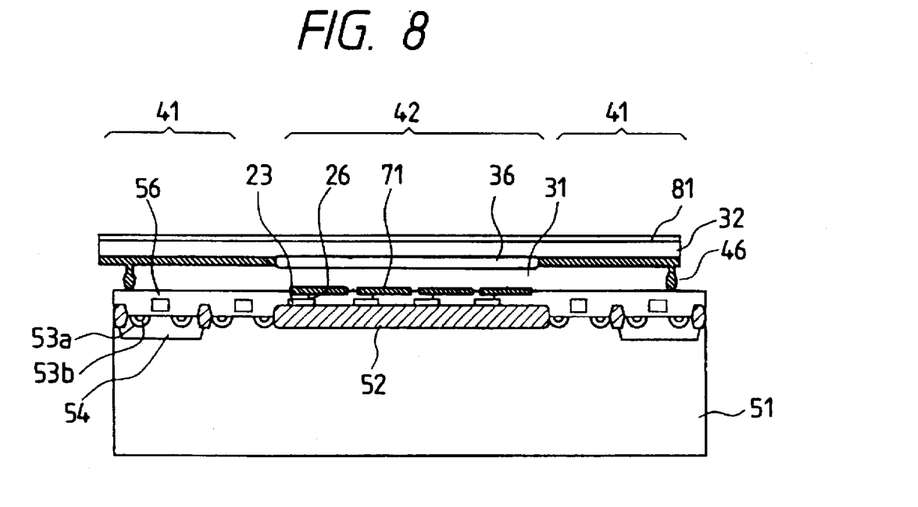
FIG. 8 is a cross-sectional view of a liquid crystal display device according to Example 3.

In Example 3, the invention is applied to a reflection type liquid crystal panel which is particularly suitable for use in a projector. FIG. 7 is a cross-sectional view of an active matrix substrate according to the present embodiment. The substrate has a similar structure to that of Example 2. However, in this embodiment, since the liquid crystal panel is of the reflection type and thus light is incident on the upper side of the panel, no portion of the substrate is removed. Furthermore, the transparent electrode 16 is replaced by the reflective electrode 71. The reflective electrode is made of a material having a large reflectance, such as aluminum. To obtain a greater reflectance, a reflective material may be deposited thick and then the deposited material may be polished for example by means of the CMP (chemical mechanical polish) technique. The other parts of the structure are the same as those shown in FIG. 5, and thus they are not described here in further detail. FIG. 8 is a cross-sectional view illustrating the active matrix substrate described above with reference to FIG. 7, installed in a reflection type liquid crystal display device. In FIG. 8, reference numeral 81 denotes a polarizer. A difference in the structure in cross section from that of Example 2 shown in FIG. 6A is that there is no color filter since three similar panels are used for the respective RGB colors. Another difference is that no black matrix is provided on the common electrode substrate 32. The other parts of the structure are the same as those shown in FIG. 6A, and therefore they are not described here in further detail. Other reference numerals in FIGS. 7 and 8 have the same meaning as in FIG. 5.

EXAMPLE 4

In Example 4, the invention is applied to a reflection type liquid crystal panel employing PDLC as the liquid crystal material. The PDLC does not need a polarizer. Therefore, the liquid crystal panel of the present embodiment has a structure similar to that shown in FIG. 8 except that no polarizer is provided. With this liquid crystal panel in conjunction with a schlieren optical system, it is possible to realize a display device capable of display a high-contrast image with a high gradation.

EXAMPLE 5

Figure 9A:
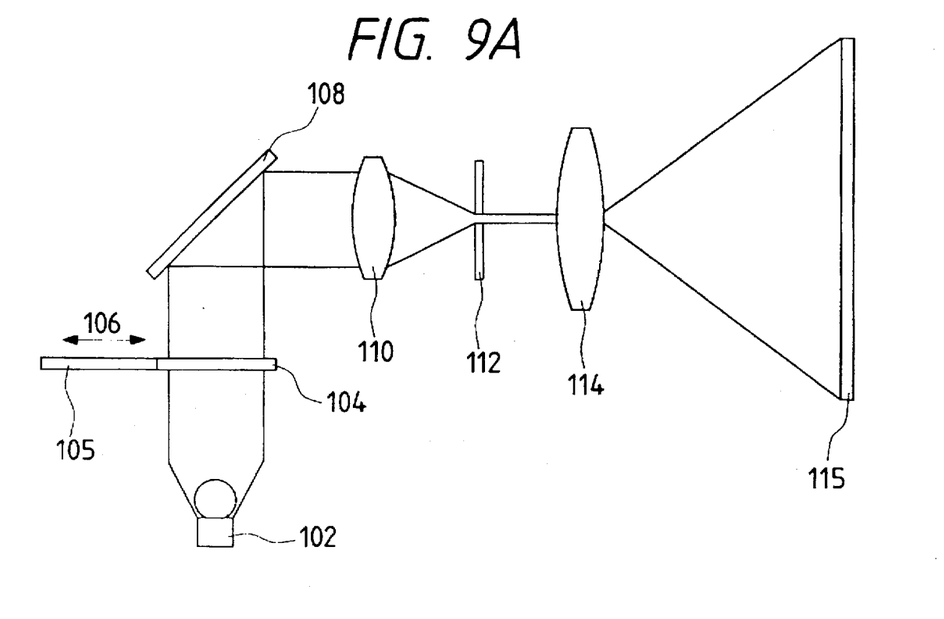
FIGS. 9A and 9B are each a schematic diagram of an enlarging optical system.
Figure 9B:
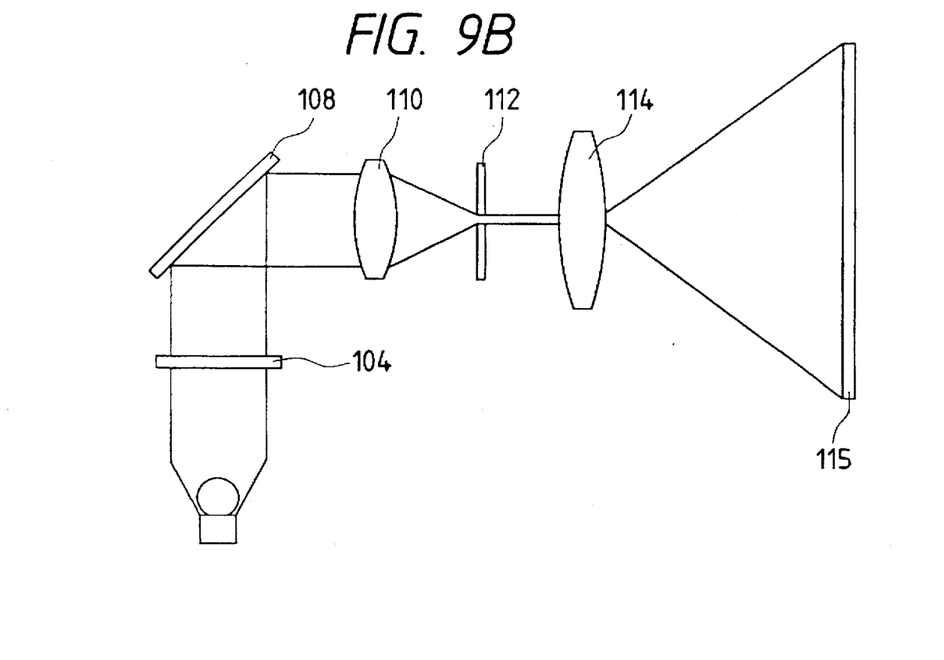

In Example 5, the invention is applied to a reflection type liquid crystal panel in conjunction with an enlarging optical system, thereby realizing a projector. FIGS. 9A and 9B illustrate the enlarging optical system wherein FIG. 9A illustrates one for use in a color projector and FIG. 9B illustrates one for use in a monochrome projector. In FIGS. 9A and 9B, reference numeral 102 denotes an illumination light source with a reflecting plate for collimating the light emitted from the light source; 104 is an infrared light blocking filter; 105 is a color filter; 108 is a liquid crystal panel; 110 is a lens; 112 is a pin hole; 114 is a projection lens; and 115 is a screen. As for the light source, a metal halide lamp or a halogen lamp with a size as small as about 1 mm may be employed. In a conventional projector, high power of 300 to 400 W is required to achieve a high brightness in a projected image, which causes devitrification in glass of the light source. Furthermore, in the conventional projector, the light source has a large size in the range of from 5 to 10 mm, which reduces the efficiency of utilization of the light. Another problem of the conventional light source is a short life. Furthermore, the high power such as 300 to 400 W results in a heavy weight of the power supply unit, which makes it inconvenient to carry it. In contrast, in the present embodiment, since the light source has a size as small as 1 mm, the light source consumes electric power as low as several tenths that of the conventional one. This can solve the problems described above.

The infrared blocking filter 104 cuts a undesirable infrared component of light and thus prevents the liquid crystal panel from being heated by the infrared component of light. The color filter 105 has one of colors of red, green, or blue. In this embodiment, the color filter 105 is not of the on-chip type, and therefore it can be realized at a simple form and at low cost. The system shown in FIG. 9A is adapted to display either a monochrome image or a color image by selecting either the color filter 105 or the infrared blocking filter 104. The selection is performed by sliding the color filter 105 and the infrared blocking filter 104 in the direction denoted by the arrow 106 in FIG. 9A. In this embodiment, the liquid crystal panel 108 is placed at a location where a mirror is placed in the conventional system. Therefore, in the present embodiment, no mirror is required, and then, the system can be realized with a less number of components. Furthermore, this structure leads to a few percent of improvement in the utilization efficiency of light. The lens 110 and the pin hole 112 are formed in conjunction with a schlieren optical system. An image is projected via the projection lens 114 onto the screen 115.

EXAMPLE 6

Figure 10A:
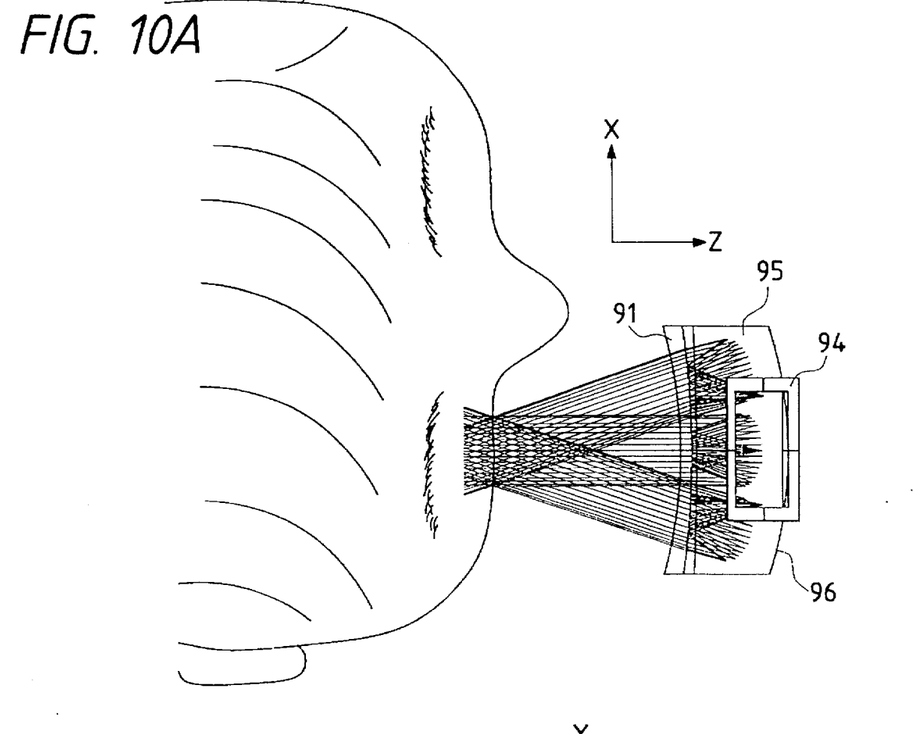
FIGS. 10A and 10B are each a schematic diagram illustrating the optical path of a head-mounting display device.
Figure 10B:
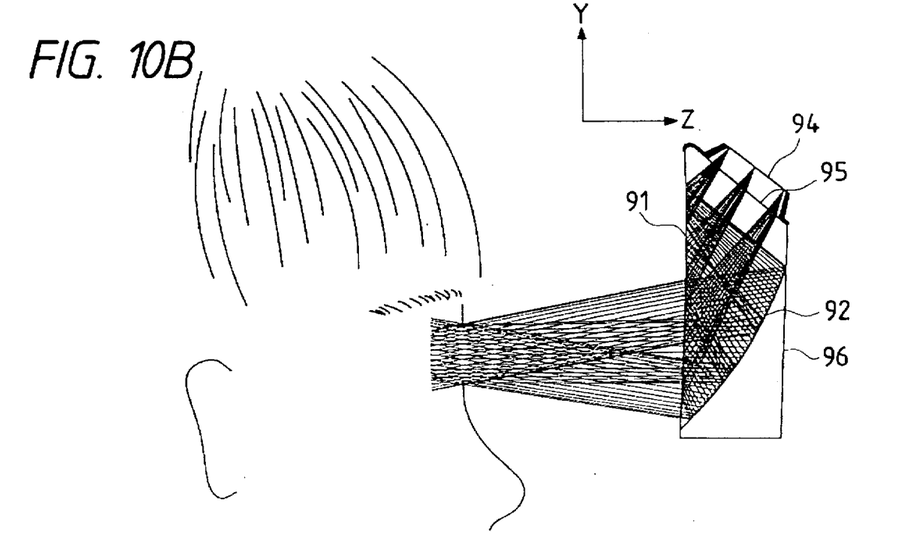

In Example 6 of the invention, a transmission type liquid crystal panel is installed on spectacles so as to realize a head-mounting display device. FIGS. 10A and 10B are a schematic diagram illustrating the optical path of the head-mounting display device, wherein FIG. 10A is a view seen from the above, and FIG. 10B is a view seen from a side of a head. In FIGS. 10A and 21B, reference numeral 91 denotes a total reflection plane; 92 is a concave mirror; 94 is a liquid crystal panel; 95 is an incidence light plane; and 96 is a frame of the spectacles. The liquid crystal panel 94 modulates the light incident from the outside. The modulated light is directed to the total reflection plane 91 via the incidence light plane 95. The total reflection plane 91 reflects all the modulated light to the concave mirror 92 which in turn reflects the light toward human eyes. The concave mirror 92 may also superimpose a scene of the outside on an image and provides the resulting superimposed image to human eyes. This head-mounting display device can display either the same image on both right and left panels, or images different between the right and left panels so that a stereoscopic image can be obtained.

What is claimed is:

1. A display device comprising:
    an active matrix substrate comprising;
        a hydrogen supply layer located above a semiconductor region in such a manner that said hydrogen supply layer is apart from said semiconductor region,
        a hydrogen diffusion barrier layer made of a high melting point metal or a compound thereof, said hydrogen diffusion barrier layer being located on said hydrogen supply layer in such a manner that said hydrogen diffusion barrier layer is contacted with said hydrogen supply layer,
        a pixel electrode located on said hydrogen diffusion barrier layer via an insulating layer, in which said hydrogen diffusion barrier layer also serves as a light blocking layer,
    an opposite substrate located opposite said active matrix substrate; and
    a liquid crystal material disposed between said active matrix substrate and said opposite substrate.

2. A display device according to claim 1, wherein said pixel electrode is switched by a semiconductor device including said semiconductor region.

3. A display device according to claim 1 or 2, wherein said hydrogen diffusion barrier layer is electrically conductive and has a fixed electric potential.

4. A display device according to claim 1, wherein said semiconductor region is located at each intersection of a plurality of data lines and a plurality of scanning interconnections on said active matrix substrate.

5. A display device according to claim 1, wherein said insulating layer comprises SiN.

6. A display device according to claim 1, wherein said active matrix substrate comprises a glass substrate serving as an underlying substrate.

7. A display device according to claim 1, wherein said active matrix substrate includes a quartz substrate serving as an underlying substrate.

8. A display device according to claim 1, wherein said active matrix substrate includes a single-crystal silicon substrate serving as an underlying substrate.

9. A display device according to claim 8, wherein said single-crystal silicon substrate is formed in such a manner that its portion under the image display area is removed so that said display device operates as the light transmission type.

10. A display device according to claim 1, wherein said active matrix substrate includes a driving circuit disposed in a peripheral area of the image display area.

11. A display device according to claim 1, wherein said pixel electrode is transparent so that incident light can pass through said pixel electrode, thereby displaying an image.

12. A display device according to claim 1, wherein said pixel electrode is reflective so that incident light can be reflected by said pixel electrode, thereby displaying an image.

13. A display device according to claim 1, wherein said display device is adapted to project an image via an enlarging optical system, thereby displaying an enlarged image.

14. A display device according to claim 1, wherein said display device is installed on spectacles.

15. A method of producing a display device, said display device comprising:

an active matrix substrate comprising;
a hydrogen supply layer located above a semiconductor region in such a manner that said hydrogen supply layer is apart from said semiconductor region,
a hydrogen diffusion barrier layer made of a high melting point metal or a compound thereof, said hydrogen diffusion barrier layer being located on said hydrogen supply layer in such a manner that said hydrogen diffusion barrier layer is contacted with said hydrogen supply layer, and
a pixel electrode located on said hydrogen diffusion barrier layer via an insulating layer, in which said hydrogen diffusion barrier layer also serves as a light blocking layer,
an opposite substrate located opposite said active matrix substrate; and
liquid crystal material disposed between said active matrix substrate and said opposite substrate,
said method being characterized in that said hydrogen supply layer is formed by means of plasma CVD.

16. A display device comprising an active matrix substrate comprising a pixel transistor and a pixel electrode disposed at each intersection of a plurality of data interconnections and a plurality of scanning interconnections; a common electrode substrate comprising a common electrode, disposed opposite said active matrix substrate; and a liquid crystal material disposed between said active matrix substrate and said common electrode substrate, said display device being characterized in that said active matrix substrate comprises a hydrogen supply layer on said pixel transistor; and a light blocking layer on said hydrogen supply layer,
wherein said pixel electrode is disposed on said light blocking layer via an insulating film.

17. A display device according to claim 16, wherein said hydrogen supply layer comprises SiN.

18. A display device according to claim 17, wherein said hydrogen supply layer comprises amorphous silicon.

19. A display device according to any of claims 16 to 18, wherein said hydrogen supply layer has the same shape as that of said light blocking layer.

20. A display device according to claim 19, wherein said light blocking layer comprises a high melting point metal or a compound thereof.

21. A display device according to claim 20, wherein said high melting point metal is any one of Ti, Ta, or W.

22. A display device according to claim 20, wherein said high melting point metal compound is either TiN or TaN.

23. A display device according to claim 16, wherein said insulating layer comprises SiN.

24. A display device according to claim 16, wherein a storage capacitor is formed with said light blocking layer, said pixel electrode, and the insulating film disposed on said light blocking layer.

25. A display device according to claim 24, wherein said storage capacitor is disposed directly on said pixel transistor.

* * * * *